United States Patent
Crowley et al.

(10) Patent No.: US 7,589,712 B2
(45) Date of Patent: *Sep. 15, 2009

(54) KEYBOARD WITH KEYS FOR MOVING CURSOR

(76) Inventors: Robert J. Crowley, 64 Puritan La., Sudbury, MA (US) 01776; Donald N. Halgren, 35 Central St., Manchester, MA (US) 01944

(*) Notice: Subject to any disclaimer, the term of this patent is extended or adjusted under 35 U.S.C. 154(b) by 645 days.

This patent is subject to a terminal disclaimer.

(21) Appl. No.: 11/005,168

(22) Filed: Dec. 6, 2004

(65) Prior Publication Data

US 2005/0083215 A1   Apr. 21, 2005

Related U.S. Application Data

(60) Continuation of application No. 10/011,241, filed on Nov. 5, 2001, now abandoned, which is a division of application No. 09/549,080, filed on Apr. 15, 2000, now Pat. No. 6,313,762, which is a continuation of application No. 08/974,356, filed on Nov. 19, 1997, now Pat. No. 6,052,071, which is a division of application No. 08/564,631, filed on Nov. 29, 1995, now Pat. No. 5,691,716, which is a continuation-in-part of application No. 08/447,116, filed on Aug. 18, 1995, now Pat. No. 5,666,112, which is a continuation of application No. 08/098,851, filed on Jul. 29, 1993, now Pat. No. 5,459,461.

(51) Int. Cl.
*H03M 11/00* (2006.01)
*H03K 17/94* (2006.01)

(52) U.S. Cl. .................... 345/168; 345/156; 341/22

(58) Field of Classification Search ......... 345/156–178; 340/407.1; 341/22, 34; 708/138, 142

See application file for complete search history.

(56) References Cited

U.S. PATENT DOCUMENTS 3,729,197 A   4/1973   Swanson et al. ............ 273/371

(Continued)

FOREIGN PATENT DOCUMENTS

EP          201259       11/1986    ................. 400/481
WO       WO97/14217     4/1997

OTHER PUBLICATIONS

"Enlarged Cursor Key With Trackball," IBM Tech. Discl. Bull., vol. 33, No. 9, pp. 428-430, Feb. 1991.
"Smart Key," IBM Tech. Discl. Bull., vol. 28, No. 5, pp. 1859-1860, Oct. 1985.
Cook et al., "Key Matrix Using a Fluid Medium," IBM Tech. Discl. Bull., vol. 13, No. 3, Aug. 1970.

*Primary Examiner*—Amare Mengistu
*Assistant Examiner*—Jennifer Zubajlo
(74) *Attorney, Agent, or Firm*—Dorsey & Whitney, LLP

(57) ABSTRACT

Various embodiments of the present invention comprise a signal generator for sending an electrical signal from an expandable, flexible layer of material, the signal generator comprising an upper layer of flexible, resilient material and a lower layer of flexible, resilient material which between them define a cavity for enclosing an expandable material such as a cellular foam or gas, whereupon localized distortion of one of the layers of flexible material, effects a signal generation within the structure, which is transmissible through a proper circuit to an outside electrical device. A circuit may be arranged adjacent a plurality of said keys which senses when several of said keys are depressed in a skewed or sideways manner, so as to effect movement of a cursor or pointer on a monitor in communication with a processing unit and said keyboard.

14 Claims, 4 Drawing Sheets

U.S. PATENT DOCUMENTS

| | | | |
|---|---|---|---|
| 3,940,637 A | 2/1976 | Ohigashi et al. | 310/339 |
| 3,964,594 A | 6/1976 | Gabbrielli et al. | 400/472 |
| 4,017,725 A | 4/1977 | Roen | 361/680 |
| 4,017,848 A | 4/1977 | Tannas, Jr. | 341/34 |
| 4,109,118 A | 8/1978 | Kley | 200/5 E |
| 4,234,813 A | 11/1980 | Iguchi et al. | 310/366 |
| 4,261,042 A | 4/1981 | Ishiwatari et al. | 364/708.1 |
| 4,328,441 A | 5/1982 | Kroeger et al. | 310/319 |
| 4,517,421 A | 5/1985 | Margolin | 341/27 |
| 4,521,712 A | 6/1985 | Braun et al. | 310/330 |
| 4,670,664 A | 6/1987 | Hara | 307/150 |
| 4,680,577 A * | 7/1987 | Straayer et al. | 345/160 |
| 4,795,888 A | 1/1989 | MacFarlane | 235/145 R |
| 4,825,019 A * | 4/1989 | Fisher | 200/6 A |
| 4,833,457 A | 5/1989 | Graebe, Jr. | 340/626 |
| 4,939,514 A | 7/1990 | Miyazaki | 341/22 |
| 4,941,660 A | 7/1990 | Winn et al. | 340/323 |
| 5,057,819 A | 10/1991 | Valenti | 340/573 |
| 5,141,343 A * | 8/1992 | Roylance et al. | 400/472 |
| 5,142,109 A | 8/1992 | O'Meara et al. | 200/86 R |
| 5,161,760 A | 11/1992 | Terbrack | 248/118 |
| 5,163,646 A | 11/1992 | Engelhardt | 248/118 |
| 5,163,765 A | 11/1992 | Levy | 400/492 |
| 5,195,752 A | 3/1993 | Reeves et al. | 273/374 |
| 5,197,178 A | 3/1993 | Lichte et al. | 29/428 |
| 5,212,473 A | 5/1993 | Louis | 345/168 |
| 5,215,282 A | 6/1993 | Bonutti | 248/118 |
| 5,220,521 A * | 6/1993 | Kikinis | 708/138 |
| 5,252,952 A * | 10/1993 | Frank et al. | 345/157 |
| 5,269,004 A * | 12/1993 | Comerford et al. | 345/168 |
| 5,278,557 A * | 1/1994 | Stokes et al. | 341/34 |
| 5,305,181 A | 4/1994 | Schultz | 345/168 |
| 5,311,656 A | 5/1994 | Eldershaw | 29/622 |
| 5,341,133 A * | 8/1994 | Savoy et al. | 341/22 |
| 5,374,018 A | 12/1994 | Daneshvar | 248/118 |
| 5,459,461 A * | 10/1995 | Crowley et al. | 341/22 |
| 5,492,291 A | 2/1996 | Otani | 248/118.1 |
| 5,499,041 A * | 3/1996 | Brandenburg et al. | 345/174 |
| 5,502,276 A * | 3/1996 | Jameson | 84/645 |
| 5,508,719 A * | 4/1996 | Gervais | 345/157 |
| 5,521,596 A * | 5/1996 | Selker et al. | 341/22 |
| 5,595,449 A * | 1/1997 | Vitkin | 400/472 |
| 5,616,897 A | 4/1997 | Weber | 200/5 A |
| 5,642,109 A * | 6/1997 | Crowley et al. | 341/22 |
| 5,648,771 A | 7/1997 | Halgren et al. | 341/22 |
| 5,661,505 A * | 8/1997 | Livits | 345/169 |
| 5,666,112 A | 9/1997 | Crowley et al. | 341/22 |
| 5,675,361 A * | 10/1997 | Santilli | 345/168 |
| 5,691,716 A * | 11/1997 | Crowley et al. | 341/22 |
| 5,694,123 A * | 12/1997 | Selker et al. | 341/22 |
| 5,742,241 A * | 4/1998 | Crowley et al. | 341/22 |
| 5,742,242 A * | 4/1998 | Sellers | 341/22 |
| 5,879,088 A * | 3/1999 | English | 400/481 |
| 5,933,320 A | 8/1999 | Malhi | 361/680 |
| 6,019,530 A * | 2/2000 | Lanzetta et al. | 400/491.1 |
| 6,052,071 A | 4/2000 | Crowley et al. | 341/22 |
| 6,107,995 A * | 8/2000 | Dordick | 345/168 |
| 6,313,762 B1 | 11/2001 | Crowley et al. | 341/22 |
| 6,529,186 B1 * | 3/2003 | Thayer | 345/161 |
| 6,585,435 B2 * | 7/2003 | Fang | 400/479 |
| 6,646,631 B2 * | 11/2003 | Suzuki et al. | 345/157 |
| 2002/0109613 A1 | 8/2002 | Crowley et al. | 341/22 |
| 2005/0083215 A1 | 4/2005 | Crowley et al. | 341/22 |

* cited by examiner

KEYBOARD WITH KEYS FOR MOVING CURSOR

CROSS-REFERENCE TO RELATED APPLICATION(S)

This application is a continuation of U.S. patent application Ser. No. 10/011,241, filed Nov. 5, 2001, now abandoned, which was a divisional of U.S. patent application Ser. No. 09/549,080, filed Apr. 15, 2000, now U.S. Pat. No. 6,313,762, which is a continuation of U.S. patent application Ser. No. 08/974,356, filed Nov. 19, 1997, now U.S. Pat. No. 6,052,071, which is a divisional of U.S. patent application Ser. No. 08/564,631, filed Nov. 29, 1995, now U.S. Pat. No. 5,691,716, which is a continuation-in-part of U.S. patent application Ser. No. 08/447,116, filed Aug. 18, 1995, now U.S. Pat. No. 5,666,112, which is a continuation of U.S. patent application Ser. No. 08/098,851, filed Jul. 29, 1993, now U.S. Pat. No. 5,459,461. The aforementioned applications and patents are all hereby incorporated by reference in their entirety.

TECHNICAL FIELD

This invention relates to keyboards, and more particularly, to signal generating devices which have keys adapted for moving a cursor by themselves in addition to permitting other data input.

BACKGROUND OF THE INVENTION

Miniaturization of electronic devices such as calculators, computers, telephones, amusement devices, and light electronic equipment has advanced rapidly over the past few years. Data entry devices have become miniaturized as well. The term "chicklet keys" has been used to identify very small tabs or keys utilized on some small devices for data entry into that device. While their keypads are somewhat "storable", the problem with that type of terminal is that the operator has a difficult time in hitting the proper key to efficiently do the job. The data entry operators hands/fingers are relatively large, and these keys lack the full stroke, size and tactile contact feedback of full sized keyboards that are preferred. Current laptop and palmtop devices suffer from the problem of short stroke and compacted dense key layout. Further difficulties arise when cursor movement is desired. Touch pad screens are data entry devices which have replaced the "mouse" or trackball. Accuracy, however, may be lacking with such data entry devices, inasmuch as the exact location of a particular cursor/data entry point may be difficult to discern. One patent which has tried to show an improvement in the cursor moving art is U.S. Pat. No. 5,278,557 to Stokes et al. This patent, however, discloses only a single key which is dedicated exclusively to the movement of a cursor. This is similar to a joy stick "built-into" the keyboard. This does not facilitate cursor movement while the operator's hands are on the alpha/numeric keys themselves.

BRIEF SUMMARY OF THE INVENTION

Aspects of the present invention comprise a signal generator arrangement for sending an electrical signal from an input stroke, the signal generator being defined by an upper layer of flexible, resilient, plastic-like material having an inner surface into which a fluid component is pressed thereagainst, and a signal completion means arranged within the fluid component, so as to establish an electrical signal to be sent in a proper circuit when the upper layer of flexible, resilient plastic material is deformed, or pressed by the input stroke. The fluid component adjacent the upper layer of flexible, resilient plastic material may be an expandable open or closed cellular foam material. The foam material may include a conductivity additive therewithin, which conductivity within the foam increases as the foam is compressed beyond a lower limit so as to establish a signal from that vicinity of the flexible, resilient plastic material of the upper layer.

A lower layer of flexible material may be disposed adjacent to the upper layer of flexible material, so as to define a resilient cavity or foam filled chamber therebetween. The upper layer of flexible plastic material may have a plurality of molded structures formed thereon, the molded structures enclosing at least a portion of the fluid or foam filled component thereby. An arrangement of electrodes may be arranged on or adjacent the inner side of the upper layer of flexible material, the electrodes being in electrical communication with a proper circuit through at least one of the layers of flexible material, and in communication with a further electrical device.

The cavity defined by the upper and lower layers of flexible, resilient plastic material may be filled with a gas through a valve arranged between one of the layers. The signal completion arrangement may include an arrangement of strain gauges arranged adjacent the inner surface of the upper resilient, flexible layer of material.

One aspect of the invention thus comprises a signal generator for sending an electrical signal from an input stroke, comprising an upper layer of flexible, resilient plastic material having an inner surface, a fluid component pressing against the inner surface, and signal completion means arranged within the component pressing against the inner surface of the upper layer, so as to establish an electrical signal to be sent to an electrical device from the signal generator upon the receipt of a force input stroke thereon. The fluid component may in one embodiment, comprise an expandable cellular foam. The signal completion means may comprise a conductivity additive in the cellular foam. The signal generator may include a lower layer of flexible material having a periphery attached to the periphery of the upper layer, to define a fillable cavity therebetween. The upper layer has a plurality of molded structures molded therewith, the molded structures enclosing the fluid component means, and an arrangement of electrodes arranged adjacent the inner side of said upper layer, the electrodes being in electrical communication with a circuit through at least one of the layers of flexible material. A fluid controlling valve is arranged through at least one of the layers of flexible material, to permit entry of gas to the fillable cavity between the upper and lower layers of flexible material. The signal completion means in one embodiment, may comprise a strain gauge arranged adjacent the inner surface of the upper layer. The signal completion means also may comprise a plurality of layers of cellular foam, each layer having a different physical characteristic therewithin. The signal completion means may also comprise a plurality of spot electrodes arranged adjacent the inner surface of the upper layer, so as to establish a complete circuit during localized distortion of the upper layer.

Another aspect of the invention comprises a signal generator for sending information to a computer monitor to effect proportional directional movement of a pointer or cursor on that monitor, comprising a plurality of the regular alphanumeric depressible keys on the signal generator for the sending of electrical signals to the monitor through an electrical circuit, and a further electrical circuit arranged between each of said plurality of depressible keys and the signal generator, to effect motion in a cursor on the monitor, when the plurality of keys are depressed somewhat sideways or skewedly. The further electrical circuit in one embodiment, comprises a multiplicity of electrical components spaced adjacent the periphery of each of the plurality of depressible keys, each of the spaced components connected in parallel to correspondingly positioned components spaced about the other of the depressible keys, and connected to a processing unit for input to said monitor. The electrical components may comprise resistors which are variable in nature such as potentiometers, strain gages, or conductors in communication with the compressible foam (variable conductivity depending on the amount of conductors therein, and the amount of compression applied thereto), comprising part of a secondary contact point to receive signals when any of the keys are depressed or moved in a skewed or sideways direction. The signal generator may have an upper surface comprised of a layer of flexible plastic material, and the plurality of depressible keys may also formed of that flexible plastic material. A plurality of primary contact points are disposed on the lower surface of the layer of flexible material juxtaposed with respect to the secondary contact points to permit electrical communication therebetween when any of the plurality of keys are moved in a skewed manner, or pressed with an increased force to create a greater conductivity to get such cursor to move faster.

Another aspect of the invention comprises a method of generating an electrical signal in order to effect proportional movement of a cursor on a computer monitor, comprising the steps of arranging a plurality of movable (depressible) keys on a keyboard so that when any of the keys (preferably standard alpha/numeric keys) are moved, an electrical signal is sent through a first electrical circuit to a processing unit and to a monitor for display of that signal thereon, and arranging a further electrical circuit in a spaced relationship with respect to the keys, so as to send a further electrical signal to the monitor to move a cursor in a particular direction when a plurality of the keys are moved with a sideways component of motion (skewed manner). The method of generating an electrical signal includes pressing simultaneously, more than one of the plurality of depressible keys in a common skewed direction, to effect movement of the cursor or pointer on the monitor in a corresponding direction. The method of generating an electrical signal also comprises the step of increasing the force/speed of the skewed moving or increasing the number of keys simultaneously pressed in a skewed manner, to effect an increase in the speed of movement of the cursor or pointer.

Still another aspect of the invention includes a method of generating an electrical signal from a keyboard in order to effect movement of a cursor on a monitor, comprising the steps of: moving sideways a plurality of keys arranged on the keyboard so as to send a signal from a sideways motion sensor arranged with respect to each of the plurality of keys, to the monitor, to induce cursor motion in the monitor; arranging as the sideway motion sensors, a plurality of resistors about each of the plurality of keys; connecting in parallel, corresponding resistors from each of the plurality of keys, the parallel resistors arranged as a circuit connected to the processing unit, so as to establish a circuit for sending a proportionally increasing signal to the monitor, when an increasing number of keys are moved in a corresponding sideways direction. The method includes the step of arranging as the sideways motion sensors, a plurality of strain gages between the plurality of keys and the keyboard, the strain gages connected to the monitor through a processing unit, so as to establish a circuit for sending a proportional changing signal to the monitor depending on the quantity of keys moved sideways, to effect movement of the cursor or pointer. The method also includes the steps of: fabricating the upper surface of the keyboard from a layer of flexible plastic sheet material; molding the keys into a digit depressible form as a unitary component of the flexible plastic sheet material; arranging a lower layer of material as a base of the keyboard which is sealed at a common periphery with the layer of flexible plastic material comprising the upper layer; injecting a charge of compressible foam into a cavity defined between the upper layer of flexible plastic sheet material and the lower layer of material; placing a dispersion of electrically conductive particles within the foam, so as to permit portions of the foam to be electrically conductive when the particles are compacted against one another, increasing their conductivity to establish a completed circuit therein as the foam is compressed; and arranging a plurality of contacts adjacent the periphery of the lower surface of each of the plurality of keys, the contacts being part of a circuit connected to a processing unit to effect movement in a cursor or pointer on the monitor when a key is pressed sideways. The method includes the steps of: pressing downwardly towards the base of the keyboard at least one of the plurality of keys so as to send an electrical signal to the processing unit to generate an alpha/numeric response on the monitor; and moving sideways with respect to the base of the keyboard at least two of the plurality of keys so as to send an electrical signal to the processing unit to effect a corresponding movement in a cursor or pointer on the monitor; and decompressing the foam so as to separate any compacted conductive particles, to open any circuit established therein, to await further compression and establishment of another circuit therein for transmission of a signal to the processing unit and monitor.

BRIEF DESCRIPTION OF THE DRAWINGS

The objects and advantages of the various embodiments of the present invention will become more apparent when viewed in conjunction with the following drawings, in which.

DETAILED DESCRIPTION OF PREFERRED EMBODIMENTS

Figure 1:
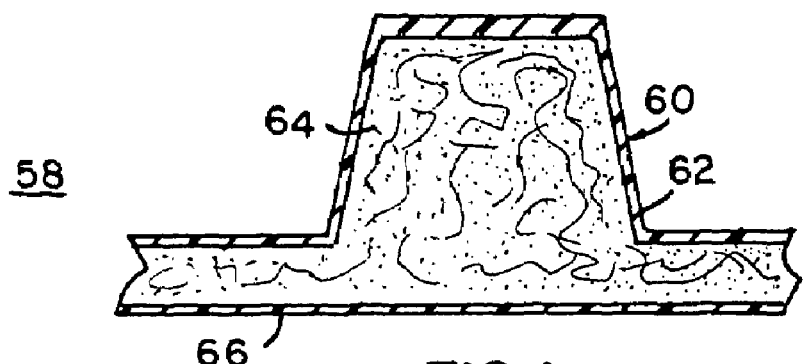
FIG. 1 is a cross-sectional view of a signal generator with a foam arranged therewithin.

One embodiment of the present invention relates to an expandable signal generator apparatus 58, as shown in a partial side-elevational view, in FIG. 1, wherein an expandable key 60 has a pre-molded upper layer 62 in a desired key configuration, having an enclosed volume of open or closed cell foam 64. The upper layer 62 of the key 60, being made from a thin layer of plastic material which flexes when pressed by an outside force. The foam 64 is yieldable when pressed, yet has sufficient stiffness to maintain the fullness of the key in the absence of pressure thereon. A lower layer of thin, flexible plastic material 66 of about 10-20 mil thick PVC, or the like, may be disposed across the bottom of the key 60, as shown in FIG. 1. The key may be one of a plurality of such keys on a signal generator 70, which may be, in one embodiment, arrangeable on the face of a force pad 68, which pad 68 utilizes "pressure" to generate a signal therewithin, as is shown in a side-elevational view, in FIG. 2.

Figure 3:
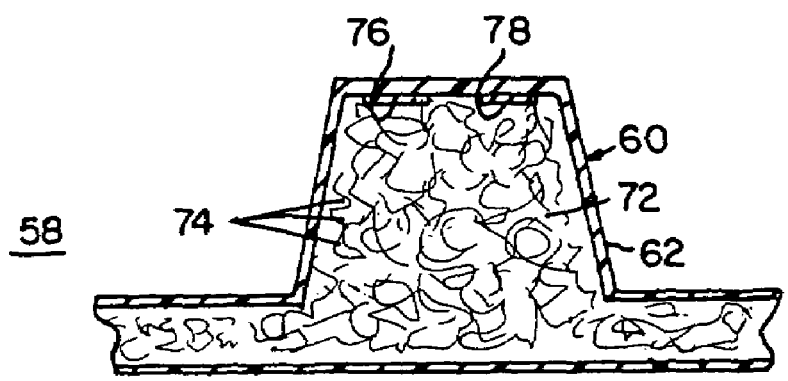
FIG. 3 is a cross-sectional view of a portion of a flexible key shown with conductive means arranged on its upper material.

The signal generator shown in FIG. 1 may have a conductive means arranged therewithin. Such conductive means may be comprised of a conductive foam material 72 as shown in FIG. 3. The foam may be conductive by virtue of a mix of metallic powder 74 in a suspension within the foam 72. A pair of electrodes 76 and 78 are shown arranged on the inner or lower side of the upper layer 62 of the flexible, plastic film. When the key 60 is distorted or compressed by an outside stroke of force, the density of the conductive components within that enclosed key 60 becomes high enough to carry a signal between the electrodes, 76 and 78. The current path between the electrodes 76 and 78, is thus complete. The electrodes 76 and 78, are part of a proper circuit, not shown, for sending the desired signal to an attached electrical device, also not shown.

Figure 4:
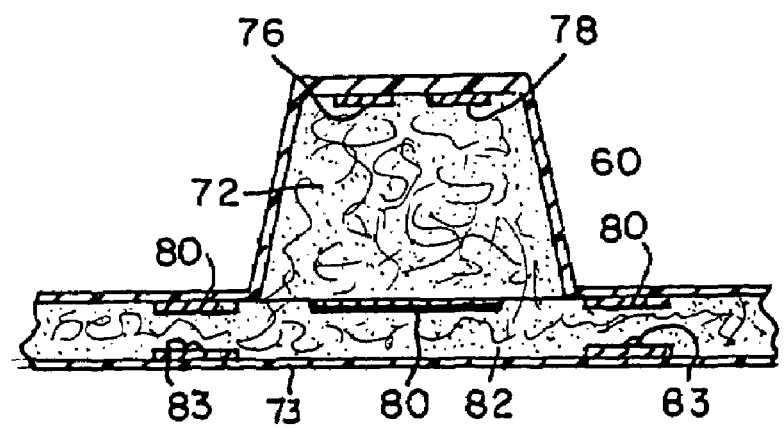
FIG. 4 is a cross-sectional view of a key of flexible keyboard, having signal establishing conductive means on the upper flexible layer and within the enclosed material as well.

Conductive strips are also shown in FIG. 4, wherein strip electrodes 80 are also arranged at a lower or base portion 82 of the conductive foam 72. Spot secondary conductive components 83, arranged within the foam 72, or on a base 73 of the generator 70, are connected to a proper response circuit, to provide directionality in the form of pointing device. Skewed pressure or distortion on one or more of the keys 60 will cause contact with, and hence signal transmission in appropriate spot electrode components such as may be disposed about the lower periphery of the appropriate keys 60, thus permitting movement of a cursor or the like, by sideways or skewed movement of the key 60, by energizing by contact, the particular secondary components 83, to which the proper circuit may be attached.

Figure 4A:
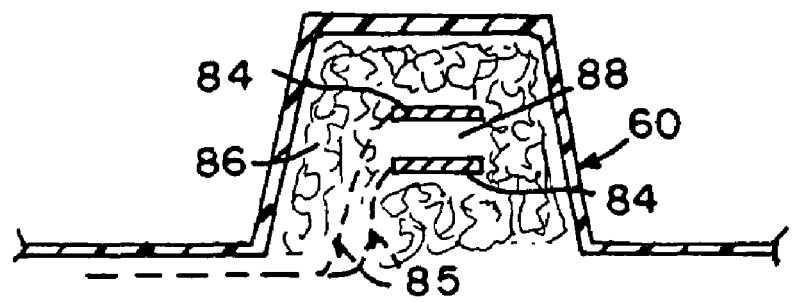
FIG. 4a is a cross-sectional view of a key for a flexible keypad, showing conductive means arranged within material disposed within the key.

In a further embodiment, thin trace metallic conductors 84 may be disposed within the foam 86, adjacent voids 88 therein, which conductors are then in contact when the key 60 is pressed or distorted by an outside force to create an electrical signal path therewithin, as shown in FIG. 4a. The conductors 84 are connected through thin wires 85, to a processor unit, not shown, to complete the data circuit. The foam 86 may, in this embodiment, also have a conductive powder dispersed therethrough, to further increase conductivity when the key 60 is compressed. Such conductivity is increased in proportion to the force applied to the movement of the key 60, because of a decrease in resistance due to the compaction and condensing of the conductive components of the foam. Similar cursor moving characteristics may be observed if the conductive components are strain gages or multiple corresponding resistors in a parallel circuit arranged on multiple keys, as described further hereinbelow.

Figure 4B:
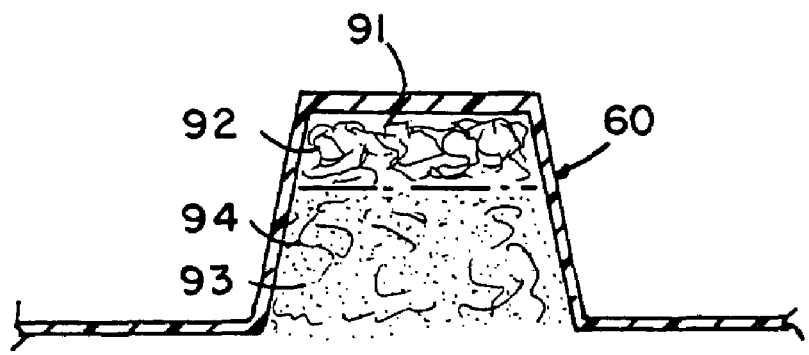
FIG. 4b is a cross-sectional view of a key on a flexible keypad having multiple density materials disposed within the molded key.

FIG. 4b shows a key 60 enclosing a foam cell material 90 having a upper foam layer 91 of high density conductive material 92 therein, and a lower layer of foam 93, of lower density conductive material 94 therein. The conductivity of the materials 92 and 94 require a higher pressure or distortion in order to effect the respective signal conducting capabilities. Such conductivity may also be effected by differing resilience/stiffness of the respective foam cells in each layer. This arrangement provides for separate signals, depending upon the amount of force/distortion applied to a key 60.

Figure 5:
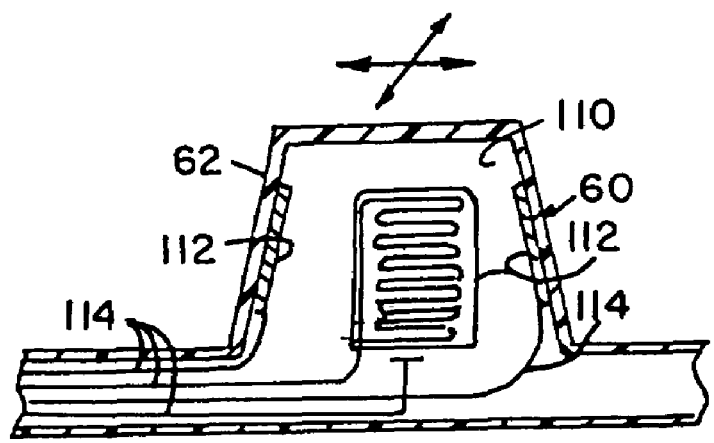
FIG. 5 is a cross-sectional view of a key on a keyboard showing a signal generating means arranged on the side walls of the molded key portion.

FIG. 5 shows a further compressible key 60 having a pressurized fluid or gas 110 therein. The upper layer 62 in this embodiment, has a plurality of strain gauges 112 spaced on its inner surface, each connected to a proper circuit 114 connected to a processor unit, not shown. These gauges 112 may be utilized with a relatively rigid key, or with a foam or gas filled key in a manner of the earlier embodiments, to indicate a direct or a skewed force against the key 60.

Figure 2A:
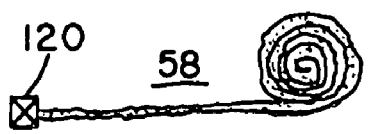
FIG. 2a is a flexible keyboard according to one embodiment of the present invention shown in a rolled up configuration.
Figure 2B:
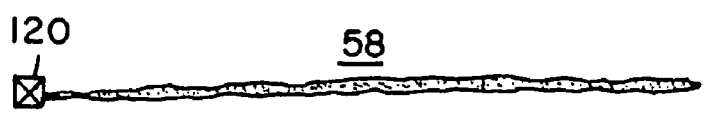
FIG. 2b is a side-elevational view of the flexible keyboard shown in FIG. 2a, in an unrolled or generally planar configuration.
Figure 2C:
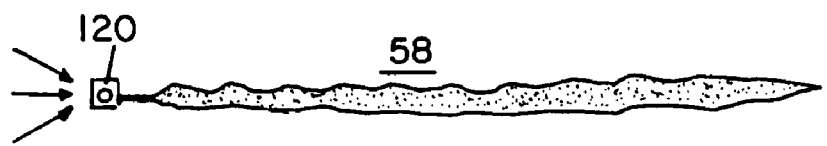
FIG. 2c is a side-elevational view of the flexible keyboard shown in FIG. 2b, in an expanding state.
Figure 2D:
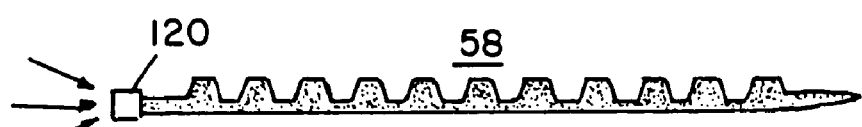
FIG. 2d is a side-elevational view of the flexible keypad shown in FIG. 2c, wherein the keypad is fully expanded.
Figure 2:
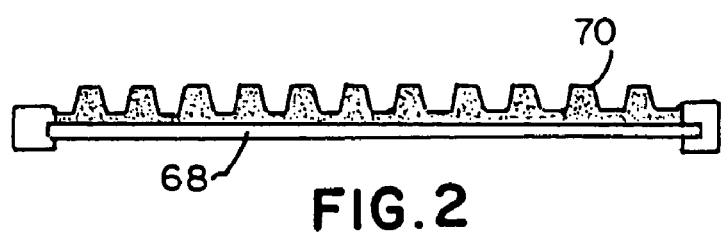
FIG. 2 is a side-elevational view of a flexible keyboard assembly arranged on a force pad.

These expandable key signal generators 58 may be stored in a collapsed or rolled up configuration, as shown in FIG. 2a. The signal generator 58 may have a valve 120 (i.e. a "duckbill" valve or the like), on one end thereof. As the rolled-up signal generator 58 unfurls, the material inside, be it foam or the like, begins to expand of its own nature, as shown in FIG. 2b. The valve 120 remains open, as shown in FIG. 2c, taking in gas/air, as the flexible upper and lower layers of the signal generator 58 are pushed apart from inside, until the expansion of the signal generator 58 is complete, as shown in FIG. 2d. The valve 120 may then be closed, (or sealed of its own accord as with a duckbill valve), thus trapping the air and the foam in which it is trapped, in its expanded most configuration. Appropriate connectors, not shown, are attached to the conductive means within the signal generator 58, to direct the signals to a proper external electric component, not shown. The connective means may be comprised of wires, trace metal strips, or optical fibers.

Figure 6:
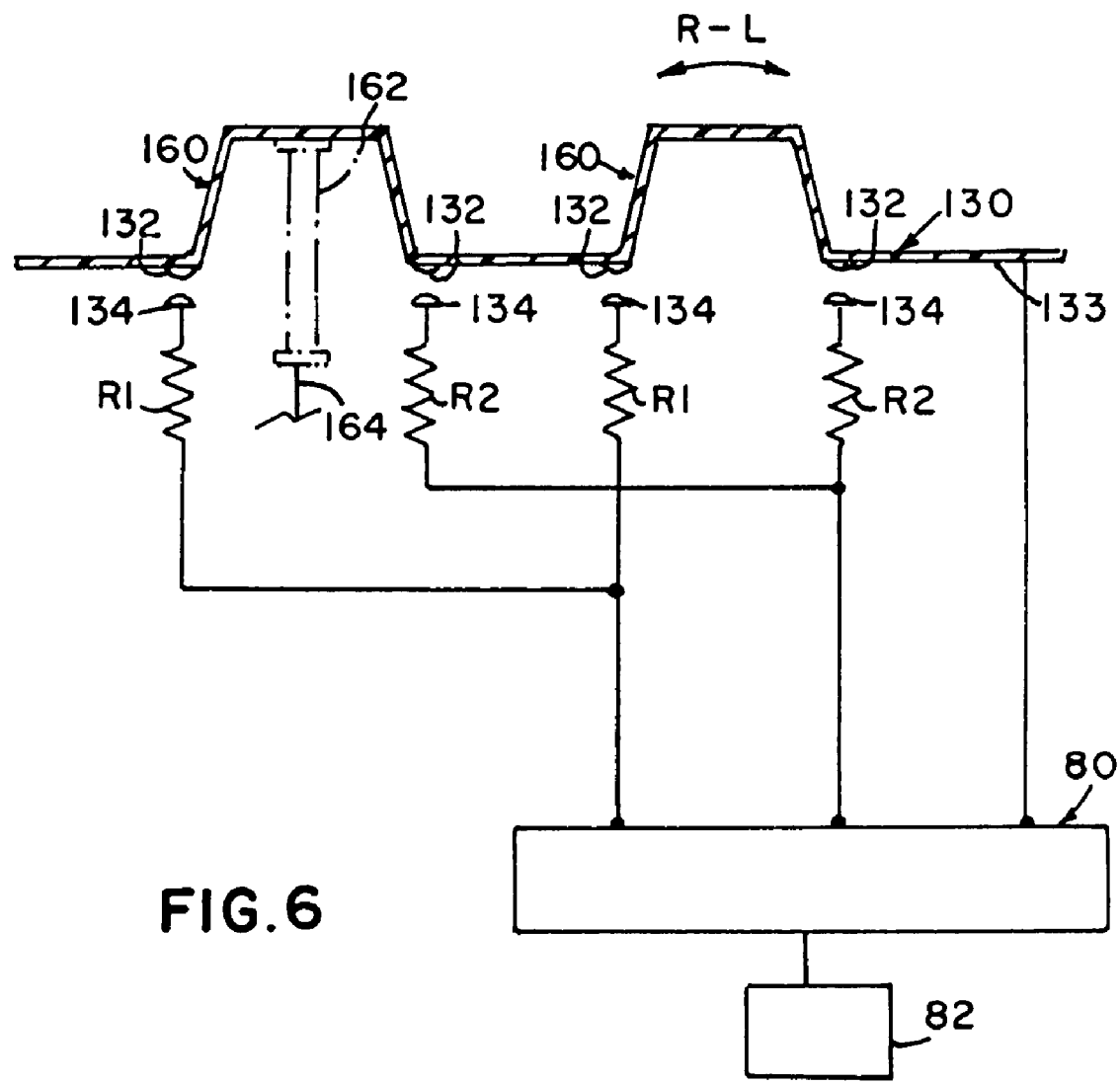
FIG. 6 is a schematic and cross-sectional representation of a portion of a keyboard showing a cursor movement arrangement according to one embodiment of the present invention.

A further aspect of one embodiment of the present invention also involves the sideways (skewed) directed force or eccentric bias typically provided to a standard alpha/numeric key when a keyboard operator presses that particular key on a keyboard. If that one key were able to move the position of the cursor on a monitor, such cursor movement would be haphazard and random when that particular key was depressed. However, if all or most of the regular alpha/numeric keys on a keyboard were made directionally sensitive through a circuit arrangement associated with each key, and when more than one such key was depressed in a skewed manner, then a computer keyboard operator could effect cursor positioning by the laying of two or more of his/her fingers on the top of the "regular" keys and skewedly depressing a plurality of those keys. This effects a summation of a plurality of resistances created when a plurality of those regular keys are moved with a sideways direction/component of motion, as shown by the arrows labeled "R-L", as shown in FIG. 6. One of the exemplary additive systems embodying this concept is shown in FIG. 6, wherein a plurality of keys 160 represent a keypad 130, all of which may be formed unitarily from a layer of flexible plastic material, as aforementioned. A plurality of primary contact points 132, properly part of a common circuit 133 for each of the keys 160, are disposed about the lower peripheral edge of each key 160. Each of the primary contact points 132 are spaced slightly apart from a secondary contact point 134. Each secondary contact point 134 is connected to a resistor R1 or R2 etc, all around the periphery of the key 160.

Each resistor R1 of each key 160 is further connected in parallel to every other resistor R1, as shown in FIG. 6. Each combined resistor R1+R1+R1 . . . is then in electrical communication with a proper computer circuit processing unit 80, which itself is in communication with a monitor 82. A similar circuit is arranged for each other resistor R2, R3 etc. around the lower periphery of each key 160. Furthermore, in a still further embodiment, the proportionally conductive foam or strain gages may be similarly connected in a parallel arrangement with similar effect, or they may be connected to a logic device, not shown, which senses the change in resistance of the keys and converts that output to a corresponding digital signal which in turn moves the cursor on the monitor 82.

Thus a computer operator may effect cursor positioning on the monitor 82, (in addition to the standard data generated when a key 160 is pressed in the "usual" way, which may include being mounted on a support post 162, and connected to its own circuit 164), by skewedly pressing a each of a plurality of keys 160 in a generally common direction, to effectuate simultaneous energization of corresponding components (R1 for each key 160, or R2 for each key 160 etc.) to effect cursor motion in a desired direction on the monitor 82. Multiple resistance in a parallel scheme shown in FIG. 6, provides a stronger signal when more keys 160 are skewedly pressed, thus providing the means to move a cursor faster, depending on the number of keys 60 or force on several keys, an operator may biasedly press or move simultaneously.

Thus what has been shown in a preferred embodiment, is a signal generating device which may be unfurled or expanded from a compressed configuration into a flexible functional orientation. The device may utilize compressible or distortable keys which are maintained in an erect state by an expanded fluid or foam material swelled therewithin. The device may also be able to provide pointing, or cursor movement on a monitor, merely by the skewed pressing of a plurality of keys on a keyboard, which is particularly useful on lightweight portable keyboards, where simplicity, convenience and storability are desired. Such cursor movement may also be accomplished by adapting alpha/numeric keys of a standard keyboard with the secondary circuit according to one embodiment of the present invention so provide an indication when such keys are being given a sideways directed force.

The additive secondary circuit is arranged so as to sense a tilted or sideways biased force against a plurality of keys to direct a signal to the central processing unit, to move a cursor or pointer in a connected monitor. There is no need for a "mouse", joy-stick, roller-ball or other contrivance to get in the way of keeping an operator's hands on the keyboard. Such an arrangement for cursor movement may also be employed in a conventional "rigid" or hard keyboard, either by placing sensors such as strain gages under the keycaps which define the conventional keys, or on the keyposts which support the keycaps on conventional keyboards, with similar effectiveness for providing electrical signals for the proportional directional movement of cursors, provided that sufficient sideways motion is permitted by the conventional key/key support mechanism.

We claim:

1. A signal generator for sending information to a computer monitor, comprising:
   a plurality of depressible keys for sending electrical signals to a processing circuit through an electrical circuit, said plurality of depressible keys being formed of a flexible material having an upper surface and a lower surface, a pressurized medium comprising at least a foam or a gas maintaining a pressure against said lower surface of said flexible material to keep said signal generator inflated; and
   a second electrical circuit arranged between at least two of said plurality of depressible keys on said signal generator, to effect motion in a cursor on said monitor if said plurality of at least two of said keys are moved in a sideways direction.

2. The signal generator as recited in claim 1, wherein said further electrical circuit comprises a multiplicity of electrical components spaced adjacent the periphery of each of said plurality of at least two of said depressible keys, each of said spaced components connected in parallel to correspondingly positioned spaced electrical components of the other of said depressible keys and to a processing unit for input to said monitor.

3. The signal generator as recited in claim 2, wherein said electrical components comprise resistors which are each connectable to a secondary contact point to receive signals when any of said keys are moved with a sideways direction of motion.

4. The signal generated as recited in claim 2, wherein said electrical components comprise strain gages.

5. The signal generator as recited in claim 3, wherein a plurality of primary contact points are disposed on said lower surface of said flexible material, juxtaposed with respect to said secondary contact points to permit electrical communication therebetween, when any of said plurality of depressible keys are skewedly moved.

6. A method of forming a signal generator to effect movement of a cursor on a computer monitor, comprising:
   arranging a plurality of depressible keys on a keyboard so that when any of said keys are depressed, an electrical signal is sent through a first electrical circuit to a processing unit and to a monitor for display said signal thereon;
   arranging a sideways motion sensor with respect to at least two of said keys, the sideways motion sensor being operable to send a further electrical signal to said monitor to move a cursor in a desired direction when a plurality of said keys having said further circuit are moved with any component of sideways motion, the sideways motion sensor comprising a plurality of resistors about each of said at least two keys; and
   connecting in parallel, corresponding resistors from each of said at least two keys, said parallel resistors arranged as a circuit connected to a processing unit to establish a circuit for sending a proportionally increasing signal to said monitor when an increasing number of keys are moved in a corresponding sideways direction.

7. A method of forming a signal generator, comprising:
   fabricating an upper surface of a keyboard from a layer of flexible plastic sheet material;
   molding a plurality of keys into a digit depressible form as a unitary component of said flexible plastic sheet material;
   arranging a lower layer of material as a base of said keyboard which is sealed at a common periphery with said layer of flexible plastic material comprising said upper layer;
   injecting a charge of compressible foam into a cavity defined between said upper layer of flexible plastic sheet material and said lower layer of material;
   placing a dispersion of electrically conductive particles within said foam to permit portions of said foam to be electrically conductive when said particles are compacted against one another, increasing their conductivity to establish a completed circuit therein as said foam is compressed; and arranging a plurality of contacts adjacent the periphery of the lower surface of each of said plurality of keys, said contacts being part of a circuit connected to a processing unit to effect movement in a cursor or pointer on said monitor when a key is pressed sideways.

8. The method of forming the signal generator as recited in claim 7, comprising:

pressing downwardly towards said base of said keyboard at least one of said plurality of keys so as to send an electrical signal to the processing unit to generate an alpha/numeric response on said monitor; and moving sideways with respect to said base of said keyboard at least two of said plurality of keys so as to send an electrical signal to the processing unit to effect a corresponding movement in a cursor or pointer on said monitor.

9. The method of forming the signal generator as recited in claim 7, comprising:

decompressing said foam to separate any compacted conductive particles to open any circuit established therein.

10. The method of forming a signal generator as recited in claim 7, further comprising injecting gas into the cavity between said upper layer of flexible plastic sheet material and said lower layer of material.

11. The method of forming a signal generator as recited in claim 7, wherein the cavity comprises a valve.

12. A method of forming a signal generator to effect movement of a cursor on a computer monitor, comprising: arranging a plurality of depressible keys on a keyboard so that when any of said keys are depressed, an electrical signal is sent through a first electrical circuit to a processing unit and to a monitor for display said signal thereon; and arranging a sideways motion sensor with respect to at least two of said keys, the sideways motion sensor being operable to send a further electrical signal to said monitor to move a cursor in a desired direction when a plurality of said keys having said further circuit are moved with any component of sideways motion, the sideways motion sensor comprising a plurality of resistors about each of said at least two keys; and arranging a plurality of strain gauges within at least two of said plurality of keys, the strain gages being operable to be coupled to said monitor through a processing unit to establish a circuit for sending a proportional changing signal to said monitor depending on the quantity of keys moved sideways to effect movement of said cursor or pointer.

13. The method of claim 12 wherein the plurality of depressible keys are expandable.

14. The method of claim 12 wherein the plurality of depressible keys are formed by injecting foam or gas into a cavity defining at least partially the plurality of depressible keys.

* * * * *

UNITED STATES PATENT AND TRADEMARK OFFICE
CERTIFICATE OF CORRECTION

PATENT NO. : 7,589,712 B2  Page 1 of 1
APPLICATION NO. : 11/005168
DATED : September 15, 2009
INVENTOR(S) : Crowley et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1039 days.

Signed and Sealed this

Twenty-first Day of September, 2010

David J. Kappos
*Director of the United States Patent and Trademark Office*